United States Patent [19]
Badyal et al.

[11] Patent Number: 5,442,318
[45] Date of Patent: Aug. 15, 1995

[54] GAIN ENHANCEMENT TECHNIQUE FOR OPERATIONAL AMPLIFIERS

[75] Inventors: Rajeev Badyal, Fort Collins, Colo.; Shao F. Shu, Hillsboro, Oreg.

[73] Assignee: Hewlett Packard Corporation, Palo Alto, Calif.

[21] Appl. No.: 138,176

[22] Filed: Oct. 15, 1993

[51] Int. Cl.$^6$ .............................................. H03F 3/45
[52] U.S. Cl. .................................. 330/253; 330/257; 330/258
[58] Field of Search ................. 330/257, 253, 258, 85, 330/260

[56] References Cited

U.S. PATENT DOCUMENTS

| | | | |
|---|---|---|---|
| 4,752,744 | 6/1988 | Adki | 330/85 |
| 5,015,966 | 5/1991 | McIntyre | 330/253 |
| 5,187,448 | 2/1993 | Brooks | 330/258 |
| 5,216,380 | 6/1993 | Carbou | 330/258 |

FOREIGN PATENT DOCUMENTS 0123275  10/1984  European Pat. Off. .............. 330/253

OTHER PUBLICATIONS

Bult, Klaas, et al, *A Fast Settling CMOS Op Amp for SC Circuits with 90-dB DC Gain*, 1990 IEEE Journal, pp. 1379–1384.

Sackinger, et al, *A High-Swing, High-Impedance MOS Cascode Circuit*, 1990 IEEE Journal (Feb.), pp. 289–298.

Allen, Phillip, et al, *CMOS Analog Circuit Design*, 1987, pp. 421–425.

Burger, Jr., Harley Franklin, *Gain Enhancement Techniques for Single-State CMOS Amplifiers*, UCLA Thesis, 1991.

*Primary Examiner*—Steven Mottola
*Assistant Examiner*—Trep H. Nguyen

[57] ABSTRACT

A folded cascode operational amplifier using an improved gain enhancement technique is described. The folded cascode includes an input section, a cascode current mirror section, and a cascode current section. A first fully-differential operational amplifier is coupled to the cascode current mirror section to provide improved gain enhancement thereto and a second fully-differential operational amplifier is coupled to the cascode current source section to provide improved gain enhancement thereto. The differential inputs of the first fully-differential operational amplifier are coupled to feedback nodes of the cascode current mirror section and the differential outputs of the first fully-differential operational amplifier are coupled to control nodes of the cascode current mirror section. The differential inputs of the second fully-differential operational amplifier are coupled to feedback nodes of the cascode current source section and the differential outputs of the second fully-differential operational amplifier are coupled to control nodes of the cascode current mirror section. Coupling the feedback nodes of both current sources to a single fully-differential operational amplifier increases the common mode noise rejection of the corresponding section.

18 Claims, 6 Drawing Sheets

GAIN ENHANCEMENT TECHNIQUE FOR OPERATIONAL AMPLIFIERS

BACKGROUND OF THE INVENTION

This invention relates generally to analog integrated circuits, and more particularly to operational amplifiers.

Operational amplifiers, more commonly known as "op-amps," are the core component in analog integrated circuits ("ICs"). An ideal operational amplifier is a differential input, single-ended or differential-ended output amplifier having infinite gain, infinite input impedance, and zero output impedance. Thus, the operational amplifier is well suited for a variety of applications in integrated circuits.

Real operational amplifiers, however, deviate from ideal behavior in significant ways. The principal effects of these deviations are (1) to limit the frequency range of the signals that can be accurately amplified; (2) to place a lower limit on the magnitude of the signals that can be detected; and (3) to place an upper limit on magnitudes of the impedance of passive elements that can be used in a feedback network with the amplifier. Thus, the gain and speed of an op-amp is compromised by the non-ideal behavior of the op-amp. In many analog ICs, the gain and speed of op-amps are the most important specifications because they ultimately determine the achievable accuracy and speed of the overall analog circuit embodied in the IC. Many design techniques have been developed to produce more ideal op-amps. Many of those techniques, however, trade off gain for speed or vice-versa. A well established technique which optimizes both gain and speed is known as gain enhancement technique.

A fully-differential folded cascode op-amp using the gain enhancement technique is shown in FIG. 1. The circuit shown is described in "A Fast-Settling CMOS Op Amp for SC Circuits with 90-dB DC gain," by Klass Bult and Govert J. G. M. Geelen, *IEEE Journal of Solid State Circuits*, Vol. 25, No. 6, Dec. 1990, pp. 1379–1384. The folded-cascode operational amplifier of FIG. 1 is comprised of a differential input section including FETS M1–M4, a cascode mirror section including FETS M5–M8, and a cascode current source section including FETs M9–M12. Auxiliary amplifiers A1–A4 are used to provide the gain enhancement, as described further below. The circuit shown in FIG. 1 is more accurately described as an operational transconductance amplifier ("OTA") because of an absence of an output stage. The transconductance amplifier is used heavily in switched capacitor ("SC") applications. The gain enhancement technique increases the output impedance of the cascode current sources through the use of negative feedback by auxiliary amplifiers A1–A4 coupled between the drain and gate of the associated cascode current transistors M7–M10, respectively. The basic operation of the gain enhancement technique can be illustrated by considering the operation of one of the cascode current sources in isolation as follows.

In FIG. 2, a cascode current source is formed by cascode transistors M9 and M11 and the corresponding auxiliary amplifier A3 of FIG. 1. In operation, if the output voltage VOUT changes, the voltage at node A will change because transistors M9 and M11 form a voltage divider. If the auxiliary amplifier A3 were not present, the voltage change in node A would produce a corresponding current change in IOUT. The auxiliary amplifier increases the output impedance of the cascode current source by means of negative feedback voltage to node A such that the voltage at node A remains constant as VOUT changes, which in turn keeps the current IOUT constant. The less the current IOUT changes as the voltage VOUT changes, the higher the output impedance. The resulting output impedance of the current source is now approximately the output impedance of the cascode transistors multiplied by the gain of the auxiliary amplifier. The output impedance of the other cascode current sources is similarly increased such that the overall output impedance of the folded cascode amplifier of FIG. 1 is increased.

The drawback of the above-described gain enhancement technique is that it increases the noise sensitivity of the op-amp. Particularly problematic for the op-amp of FIG. 1 is noise injected into the substrate on which the op-amp is formed. Substrate noise is typically generated by high-speed switching of digital circuits in a mixed analog/digital circuit. The substrate noise is non-uniformly distributed across the substrate depending on the switching behavior of the digital circuit. The substrate noise is coupled into the auxiliary amplifiers through parasitic capacitances associated with the auxiliary amplifier transistors.

The op-amp circuit shown in FIG. I is sensitive to substrate noise because of the circuit topology. The auxiliary amplifiers are formed independently from each other and are positioned relative to an associated cascode transistor. Because the auxiliary amplifiers are physically separated from each other on the substrate, different levels of substrate noise are coupled to the different auxiliary amplifiers. The different level of substrate noise cause each auxiliary amplifier to generate a different feedback voltage to the associated cascode transistor. The various feedback voltages produces an undesirable perturbation in the output voltage VOUT of the op-amp.

Accordingly, a need remains for a high-gain operational amplifier having a reduced sensitivity to noise.

SUMMARY OF THE INVENTION

It is, therefore, an object of the invention to provide an improved gain enhancement technique which increases the differential voltage gain of an op-amp without a corresponding increase in the common-mode voltage gain.

According to the present invention, a MOS operational amplifier circuit having improved gain enhancement is described. The operation amplifier includes a differential input section having a differential input pair of transistors for receiving a differential input signal and a differential output pair. The operational amplifier includes a cascode current source section having a first cascode current source and a second cascode current source. The first cascode current source is coupled to a first output of the output pair and includes a feedback node and a control node. The second cascode current source is coupled to the second output of the output pair and includes a feedback node and a control node. A first fully-differential operational amplifier is coupled to both the first and second cascode current sources to provide gain enhancement to both cascode current sources. The first fully-differential operational amplifier includes a negative input coupled to the first cascode current source feedback node, a positive input coupled to the second cascode current source feedback node, a positive output coupled to the first cascode current source control node, and a negative output coupled to the second cascode current source control node.

The operational amplifier further includes a cascode current mirror section having a first mirror current source coupled to the first output and a second mirror current source coupled to the second output. The first mirror current source includes a feedback node and a control node. The second mirror current source also includes a feedback node and a control node. The cascode current mirror includes a second fully-differential operational amplifier coupled to the first and second mirror current sources to provide gain enhancement to both mirror current sources. The second fully-differential operational amplifier includes a negative input coupled to the first mirror current source feedback node, a positive input coupled to the second mirror current source feedback node, a positive output coupled to the first mirror current source control node, and a negative output coupled to the second mirror current source control node. The second fully-differential operational amplifier, therefore, provides negative feedback to the first and second mirror current sources. The fully differential operational amplifier results in a high differential-mode voltage gain while maintaining the common-mode voltage gain.

An advantage of the present invention is that the improved gain enhancement technique requires less circuit area.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

Figure 3:
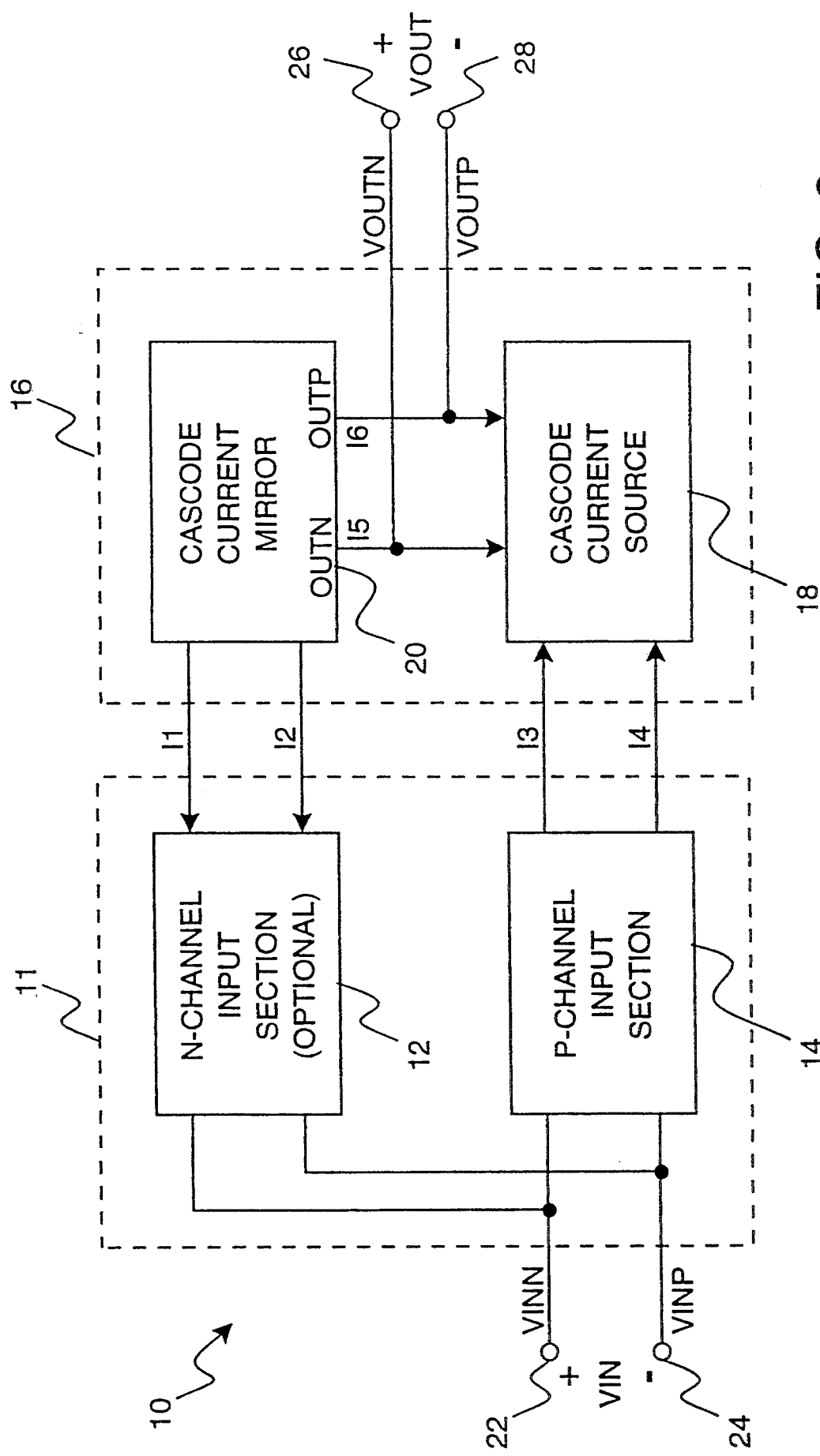
FIG. 3 is a block diagram of a folded cascode operational amplifier according to the invention.

Referring to FIG. 3, a block diagram of a CMOS amplifier circuit 10 is shown having a differential input and a differential output. The differential input includes of a differential input pair including a positive input terminal 22 and a negative input terminal 24. An input voltage signal VIN is impressed across the input terminals 22 and 24. The input voltage VIN includes two single-ended input voltages VINN and VINP impressed on input terminals 22 and 24, respectively. The amplifier of FIG. 3 further includes a differential input section 11 and a folded cascode gain stage 16. Optionally, a differential to single-ended output stage (not shown) can be coupled to the differential output, if the application so requires.

The differential input section 11 includes a P-channel input section 14. P-channel input section 14 has a differential input pair of transistors coupled to the differential input terminals 22, 24 of amplifier circuit 10. The P-channel input section 14 includes a differential output pair of transistors for sourcing signal currents 13 and 14 to a cascode current source 18. Optionally, an N-channel input section 12 can be included as shown in FIG. 3 for a greater input voltage range. The N-channel input section 12 also has a differential input pair coupled to the differential input terminals 22, 24 of amplifier circuit 10. The N-channel input section 12 includes a differential output pair for sinking signal currents 11 and 12 from a cascode current mirror 20. The N-channel input section 12 is an N-channel version of the P-channel input section 14, as is known in the art of analog design. Alternatively, the N-channel input section can be used and the P-channel input section can be eliminated. The use of both the N-channel input section 12 and the P-channel input section 14, however, allows the input signal VIN to extend over the entire voltage range of the power supply. The elimination of one of the input sections simply reduces the input voltage range by a transistor threshold voltage VT.

Folded cascode gain stage 16 includes a cascode current source 18 and the cascode current mirror 20. Cascode current mirror 20 has a first output ("OUTN") coupled to a corresponding input of the cascode current source 18 for supplying current 15. Cascode current mirror 20 further includes a second output ("OUTP") that is coupled to a corresponding input of the cascode current source 18 for supplying current 16.

Operational amplifier 10 includes output terminals 26 and 28, which are coupled to cascode current mirror outputs OUTN and OUTP, respectively. The output terminals 26 and 28 form the differential output. A differential output voltage VOUT is produced on output terminals 26, 28. The differential output voltage VOUT includes output signals VOUTN produced on cascode current mirror output OUTN and output signal VOUTP produced on cascode current mirror output OUTP. The inventive principle hereinafter described effectively increases the differential voltage gain of the amplifier 10 at terminals 26, 28 while maintaining the common mode voltage gain, thereby increasing the common mode rejection ratio of the amplifier 10.

Figure 4:
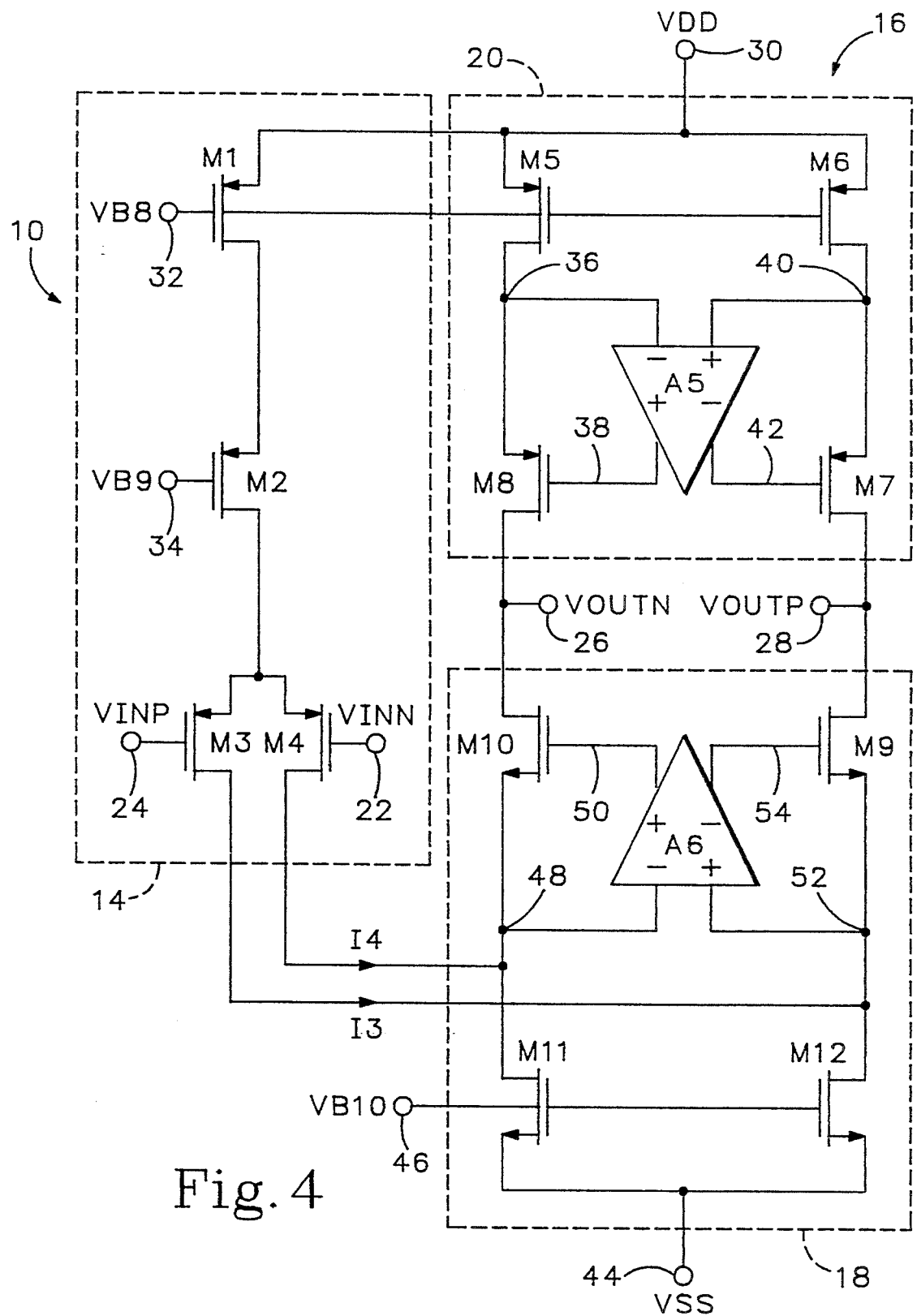
FIG. 4 is a schematic diagram at the FET level of the operational amplifier of FIG. 3.

Referring now to FIG. 4, a CMOS FET level schematic diagram of an embodiment of the operational amplifier 10 is shown. The embodiment shown corresponds to the prior art amplifier design of FIG. 1 for illustrative purposes. It should be appreciated, however, that the circuit topology of the two designs are noticeably distinct, as described further below. The embodiment shown includes the P-channel input section 14 but omits the N-channel input section 12 for simplicity. As described above, however, the invention hereinafter described applies equally as well to amplifiers having an N-channel input section or both P-channel and N-channel input sections as shown in FIG. 3, as is apparent to one skilled in the art.

The P-channel input section 14 includes four field-effect-transistors ("FET") forming a differential amplifier, including P-channel FETS M1, M2, M3 and M4. FETS M1 and M2 form a biasing current source for input FETS M3 and M4. Alternatively, a single N-channel FET can be used in placed of FETS M1 and M2, or any equivalent current source. The negative differential input terminal 24 is coupled to a gate of FET M3 for receiving input voltage VINP. The positive differential input terminal 22 is coupled to a gate of FET M4 for receiving input voltage VINN. The sources of FETs M3 and M4 are coupled together to form a common source node that is coupled to the current source.

The biasing current source includes a serial connection of P-channel FETs M1 and M2. The source of M1 is coupled to terminal 30 which receives a positive supply voltage VDD. In the preferred embodiment VDD is approximately 5 volts. The gate of M1 is coupled to a terminal 32 for receiving a first bias voltage VBS. The first bias voltage is at a voltage level to force FET M1 to operate in the saturation region, as is known in the art. The drain of FET M1 is coupled to the source of P-channel FET M2. The drain of FET M2 is coupled to the sources of P-channel FETs M3 and M4 for providing the bias current thereto. The gate of FET M2 is coupled to a second source of bias voltage VB9. The second source of bias voltage biases FET M2 conduct constant current approximately equal a to the sum of 13 and 14 and, thus, act as a current source for differential input FETs M3 and M4.

The P-channel input section 14 is operable when the input voltage signal falls below the supply voltage VDD by three drain-to-source saturation voltage drops, i.e., 3×VDSAT, plus a threshold voltage drop VT, in order for bias FETs M1, M2 and P-channel input FETs M3 and M4 to remain in saturation. The P-channel input section 14 will remain operable as long as the input voltage signal VIN remains below VDD by two VDSAT plus one VGS, i.e., VDD −(2×VDSAT+VGS), and can extend to VSS. The two VDSAT voltage drops account for the voltage drop across cascode current source FETs M1 and M2. The VGS voltage drop accounts for the voltage drop across input FETs M3 and M4.

Operational amplifier 10 further includes the folded cascode gain stage 16. The folded cascode gain stage includes two subsections: a cascode current mirror 20 including P-channel FETs M5, M6, M7, and M8 and the cascode current source 18 including N-channel FETs M9, M10, M11 and M12.

Cascode current mirror 20 includes two current sources: a first mirror current source including N-channel FETs M5 and M8 coupled to output terminal 26; and a second mirror current source including N-channel FETs M6 and M7 coupled to output terminal 28. Both the first and second mirror current sources are configured as mirrors of the input section biasing current source. The source of FET M5 is coupled to terminal 30 to receive the supply voltage VDD and the gate of M5 is coupled to terminal 32 to receive the first bias voltage VB8. Thus, FET M5 has the same gate-to-source voltage has FET M1. FET MS, therefore, supplies approximately the same current as FET M1 assuming FET M1 and M5 have the same W/L ratio. FET M8 is connecting in series with mirror FET M5. The source of FET M8 is coupled to the drain of FET M5, which forms a feedback node 36. The drain of M8 is coupled to the output terminal 26 for supplying current to the cascode current source 18. The gate of M8 is coupled to a control node 38. The feedback node 36 and the control node 38 are coupled to a fully-differential amplifier A5, as described further below.

Cascode current mirror 20 further includes a second mirror current source including P-channel FETs M6 and M7. P-channel FET M6 is configured as a mirror of M1. The source of FET M6 is coupled to terminal 30 for receiving supply voltage VDD and the gate of M6 is coupled to terminal 32 to receive the first bias voltage VB8. Therefore, FET M6 also supplies approximately the same current as FET M1, assuming FET M1 and M6 have the same W/L ratio. FET M7 is connected in series with mirror FET M6. The source of FET M7 is coupled to the drain of FET M6, which forms a feedback node 40. The drain of M7 is coupled to the output terminal 28 for supplying current to the cascode current source 18. The gate of FET M7 is coupled to a control node 42. The feedback node 40 and the control node 42 are coupled to the fully-differential amplifier AS, as described further below.

The operational amplifier A5 is a conventional fully-differential operational amplifier. The operational amplifier A5 is fully-differential in that the amplifier has both a pair of differential inputs and a pair of differential outputs. The differential input pair consists of a negative input and a positive input, as indicated by negative (−) and positive (+) indicia on the amplifier symbol in FIG. 4, respectively. The differential output pair consists of a negative output (−) and a positive output (+).

The fully-differential operational amplifier is a differential operational amplifier with a common-mode feedback section coupled between the amplifier output pair. As a result of the common,mode feedback section, the fully-differential operational amplifier has a higher common mode rejection ratio than a single-ended operational amplifier. A typical example of a fully-differential operational amplifier, such as required by the invention, is shown and described with reference to FIG. 5 below. The invention is not limited to the fully-differential amplifier design shown therein, however. Any fully-differential amplifier design having a comparable common mode gain is equivalent.

The negative input of the operational amplifier A5 is coupled to the first mirror current source feedback node 36. The positive input of the operational amplifier A5 is coupled to the second mirror current source feedback node 40. The positive output of the operational amplifier A5 is coupled to the first mirror current source control node 38 and the negative output is coupled to the second mirror current source control node 42. Thus, the fully-differential amplifier A5 produces negative feedback to control nodes 38 and 42.

Fully-differential amplifier A5 operates by monitoring a first feedback voltage at feedback node 36 as well as a second feedback voltage at feedback node 40. The fully-differential amplifier A5 detects a difference between the first and second feedback voltages and amplifies the detected difference. The amplified detected difference is applied to control nodes 38 and 42 as first and second control voltages, respectively. The first and second control voltages are of equal amplitude and opposite polarity. Thus, a difference between the first feedback voltage and the second feedback voltage produces simultaneous control voltages at the control nodes having equal amplitudes and opposite polarities, thereby modulating current through the respective current sources in equal amounts and of opposite direction. Common-mode voltages, e.g., due to supply voltage perturbations, that appear on both feedback nodes 36 and 40, however, are not amplified by the fully-differential amplifier A5 because of its common-mode rejection.

Figure 1:
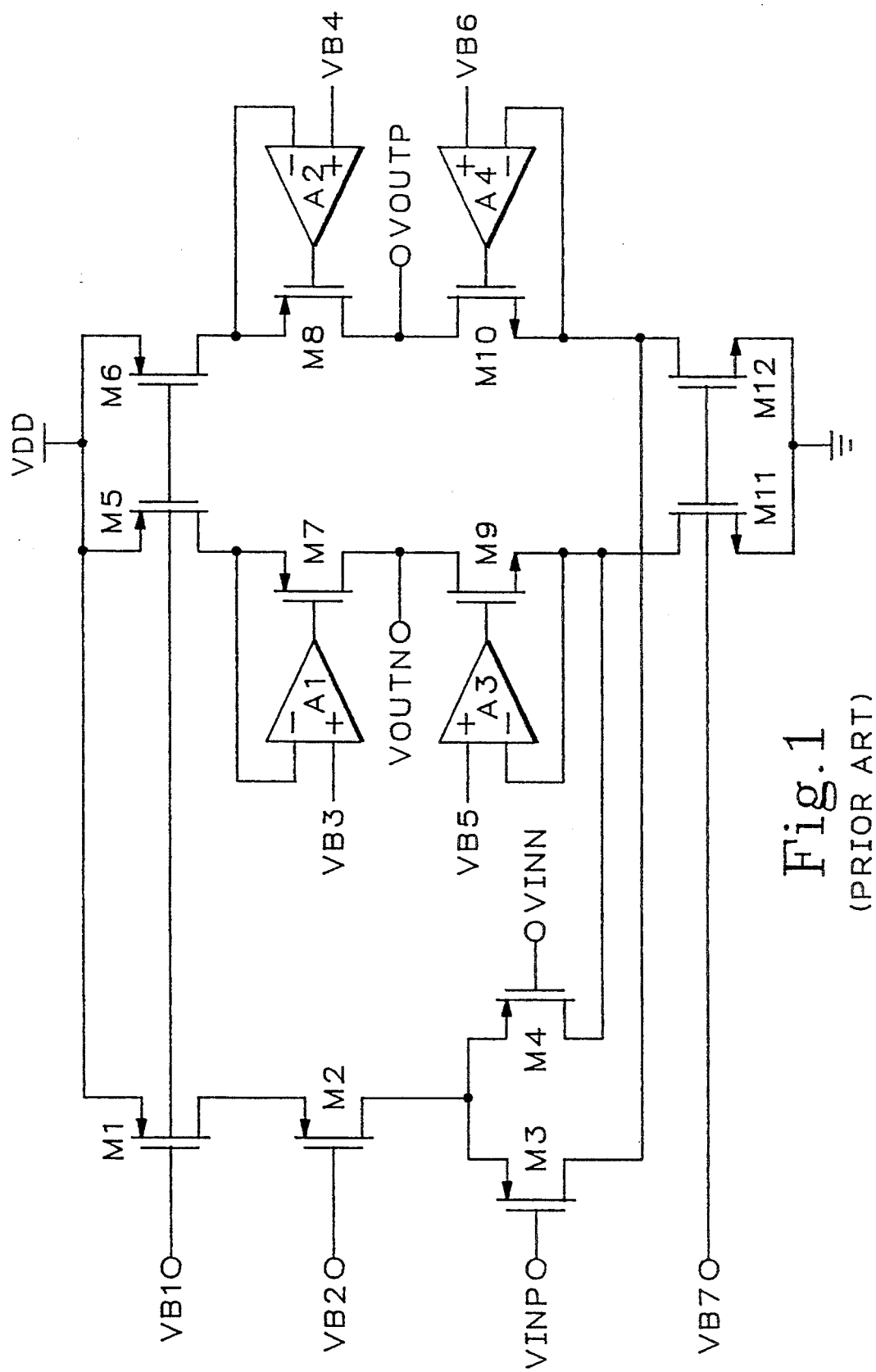
FIG. 1 is a schematic diagram of a prior art operational amplifier circuit with gain enhancement.
Figure 2:
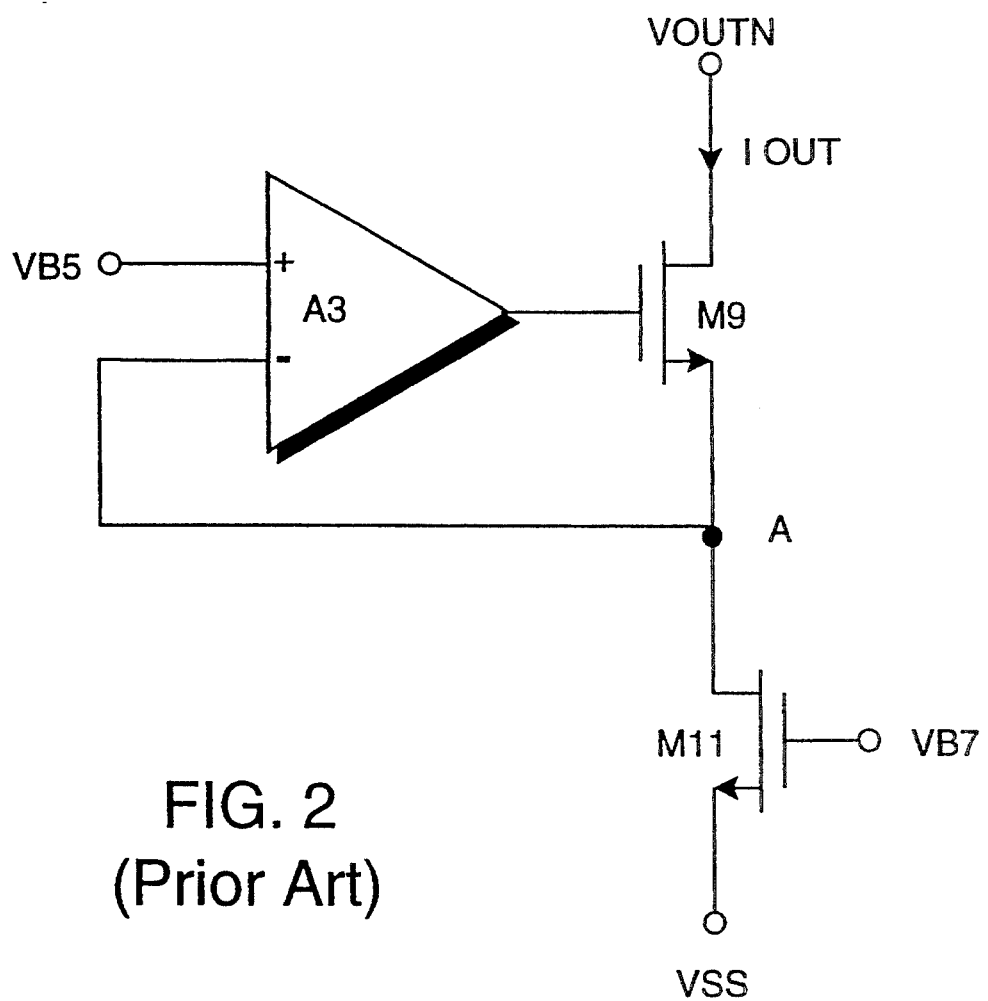
FIG. 2 is a schematic diagram of a current source of the operational amplifier of FIG. 1 illustrating the gain enhancement.

The fully-differential operation amplifier A5 is less sensitive to noise than the single ended amplifiers used in the prior art gain enhancement techniques because the fully-differential operational amplifier is fabricated within a confined physical area on the substrate of the integrated circuit (IC). Thus, noise that is coupled into the operational amplifier A5 through the substrate is generally received as a common mode voltage. In contrast, the two single-ended amplifiers A1 and A2 used in current mirror of FIG. 1 are typically fabricated at different locations on the silicon substrate. Thus, the amount of noise coupled through the substrate to amplifier A1 differs from that coupled to amplifier A2, thereby producing a differential noise component which adversely affects the gain enhancement.

Folded cascode gain stage also includes a cascode current source 18. Cascode current source 18 includes two current sources: a first cascode current source including N-channel FETs M10 and M11 coupled to output terminal 26; and a second cascode current source including N-channel FETs M9 and M12 coupled to output terminal 28. The source of FET M11 is coupled to terminal 44 to receive the supply voltage VSS and the gate of M11 is coupled to terminal 46 to receive a third bias voltage VB10. FET M11 is biased into saturation to sink a constant current, approximately equal to the current supplied by the first mirror current source. FET M10 is connecting in series with FET M11. The source of FET M10 is coupled to the drain of FET M11, which forms a feedback node 48. The drain of M10 is coupled to the output terminal 26 for receiving the current supplied by the first mirror current source. The gate of M10 is coupled to a control node 50. The feedback node 48 and the control node 50 are coupled to a second fully-differential amplifier A6, as described further below.

The drain of FET M11 is coupled to the drain of input FET M4 of the input section 14. The current supplied by the input FET M4 is combined with the current supplied by FET M10. Because FET M11 is biased to sink a constant current, any change in the current supplied by FET M4 will produce a corresponding and opposite change in the current supplied by FET M10. The corresponding and opposite change in the current supplied by FET M10 results in a corresponding change in the output voltage VOUTN.

Cascode current source 18 further includes a second cascode current source including N-channel FETs M9 and M12. The source of FET M12 is coupled to terminal 44 for receiving supply voltage VSS and the gate of M12 is coupled to terminal 46 to receive the third bias voltage VB10. FET M9 is connected in series with FET M12. The source of FET M9 is coupled to the drain of FET M12, which forms a feedback node 52. The drain of M9 is coupled to the output terminal 28 for receiving current from the second mirror current source. The gate of M9 is coupled to a control node 54. The feedback node 40 and the control node 42 are coupled to the second fully-differential amplifier A6, as described further below.

The drain of FET M12 is coupled to the drain of input FET M3 of the input section 14. The current supplied by the input FET M3 is combined with the current supplied by FET M9. FETs M3 and M12 operate in an identical manner as FETs M4 and M11, i.e., any change in the current supplied by FET M4 will produce a corresponding and opposite change in the current supplied by FET M12. Alternatively, the drain of M3 can be coupled to the drain of M11 and the drain of M4 can be coupled to the drain of M12, which changes the polarity of the output voltage signal VOUT.

The cascode current source 18 further includes a second fully-differential operational amplifier A6. The second fully-differential operational amplifier is, in the preferred embodiment, identical to the fully-differential operational amplifier A5. The second fully-differential operational amplifier A6 includes a differential input pair consisting of a negative input and a positive input, as indicated by negative (−) and positive (+), and a negative (−) and a positive (+) output. The negative input of the operational amplifier A6 is coupled to the feedback node 48 of the first cascode current source. The positive input of the operational amplifier A6 is coupled to the feedback node 50 of the second mirror current source. The positive output of the operational amplifier A5 is coupled to the control node 50 of the first mirror current source and the negative output is coupled to the control node 54 of the second mirror current source.

The second fully-differential amplifier A6 provides gain enhancement to the cascode current source 18. The second fully-differential amplifier A6 operates in an identical manner as the first fully-differential amplifier A5, as described above. The second fully-differential amplifier A6 also provides an increased level of noise immunity over the prior art gain enhancement techniques using single ended operational amplifiers. In the preferred embodiment, the first and second fully-differential amplifiers A5 and A6, respectively, are both used simultaneously as shown in FIG. 4. Using both fully-differential amplifiers A5 and A6 results in the highest output impedance of the circuit. Although not the preferred design, the operational circuit does operate with only one fully-differential amplifier and not the other.

Figure 5:
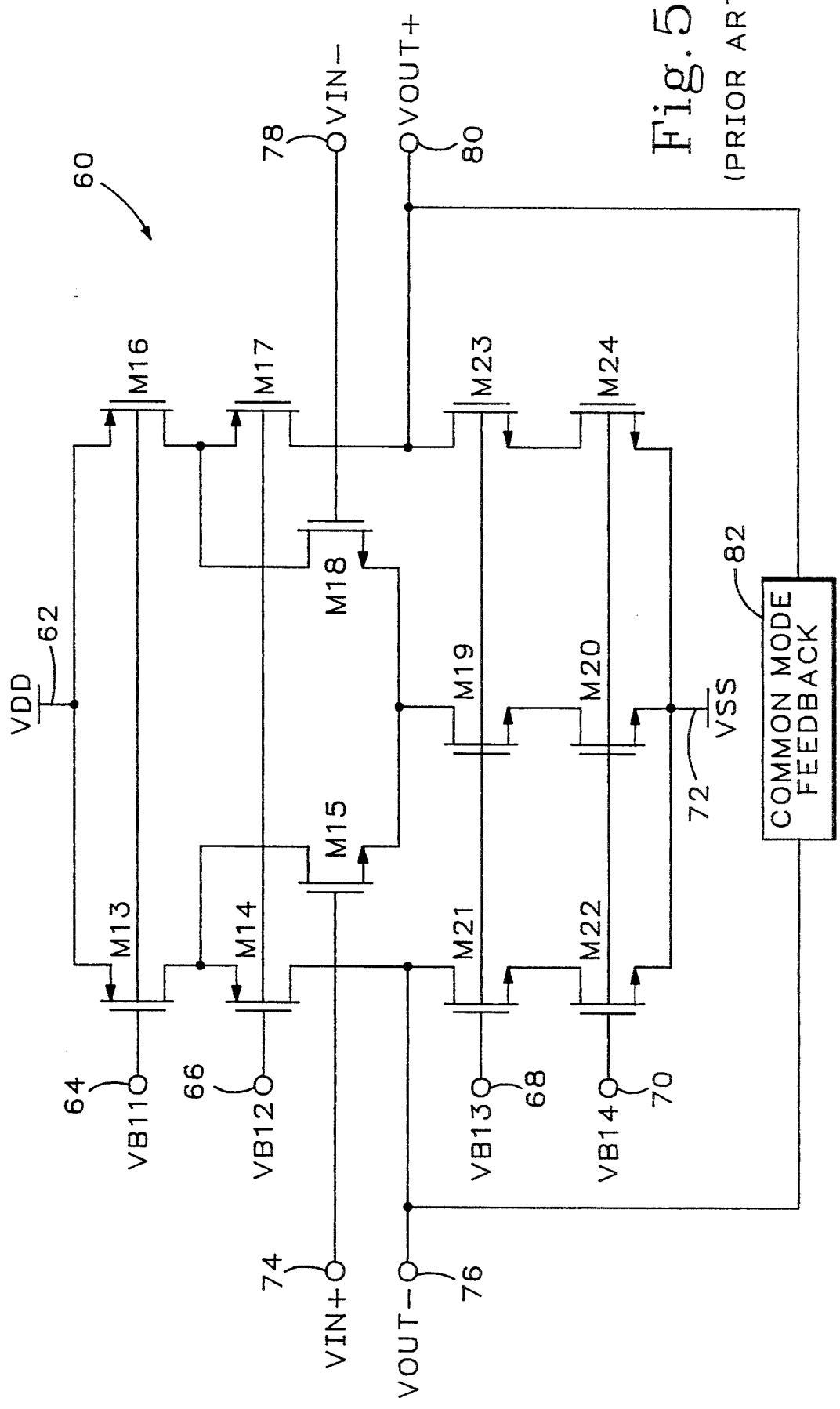
FIG. 5 is a schematic diagram at the FET level of the fully-differential operational amplifier of FIG. 4.

Referring now to FIG. 5, a FET level schematic of a fully-differential amplifier 60 is shown. The fully-differential amplifier 60 is an embodiment of fully-differential amplifier A5 shown above in FIG. 4. Although the schematic in FIG. 5 is a preferred embodiment of the fully-differential amplifier, the gain enhancement technique herein described is not limited to the differential amplifier implementation shown. Also, fully-differential amplifier A6 shown in FIG. 4 is simply a mirror image of the implementation shown, as is known in the art. The mirror implementation is generally formed by substituting N-channel FETs for P-channel FETs and vice versa, and appropriately biasing the mirrored FETs.

Fully-differential amplifier 60 includes P-channel FETs M13 and M14 connected in series, which are further connected in series with N-channel FETs M21 and M22 which are themselves connected in series. Similarly, the amplifier 60 includes P-channel FETs M16 and M17 connected in series, which are further connected in series with series N-channel FETs M23 and M24. N-channel FETs M21 and M22 form a current source for biasing P-channel FETs M13 and M14. Similarly, N-channel FETs M23 and M24 comprise a current source to bias P-channel FETs M16 and M17. Other known current source configurations are equivalent.

The amplifier 60 also includes a differential input section including N-channel FETs M15, M18, M19, and M20. FETs M15 and M18 form a differential input pair and FETs M19 and M20 form a corresponding bias current source. The drain of FET M15 is coupled to the drain of M13. The drain of FET M18 is similarly coupled to the drain of FET M16. The gate of FET M15 is coupled to terminal 74 for receiving a positive input signal VINe−. Similarly, the gate of FET M18 is connected to terminal 78 for receiving a corresponding negative input signal VIN−. The positive and negative input signals VIN+ and VIN−, respectively, form the differential input of the fully-differential amplifier 60. The sources of FETs M15 and M18 are coupled together and further coupled to the series pair of FETs M19 and M20.

Bias voltage sources VB11–VB14 are used to bias the amplifier FETs into the appropriate operating range. Bias voltage VB11 is coupled to terminal 64 which is connected to the bases of FETs M13 and M16. Bias voltage source VB12 is coupled to terminal 66, which is coupled to the bases of FETs M14 and M17. Bias voltage VB13 is coupled to terminal 68 which is connected to the gates of FETs M21, M23, and M19. Bias voltage source VB14 is, similarly, coupled to terminal 70, which is connected to the bases of FETs M22, M24, and M20. The selection of the actual voltage levels of the bias voltage sources is a function of the operating range of the amplifier, i.e., VSS to VDD.

The fully-differential amplifier 60 has a fully-differential output formed by output terminal 76 and 80. Output terminal 76 is coupled to the drains of FETs M14 and M21. A negative output voltage VOUT− is produced on output terminal 76 responsive to the differential input signal. Similarly, output terminal 80 is connected to the drains of FETs M17 and M23 and a positive differential output signal VOUT+ is produced on output terminal 80 responsive to the differential input signal. A common mode feedback network 82 is coupled between output terminals 76 and 80. The common feedback network 82 applies a feedback control voltage to the output of the fully-differential amplifier to maintain the common mode output voltage at a predetermined bias voltage. The exact value of the bias voltage is determined by the operating parameters of the underlying amplifier. The common mode feedback network 82 can take on a variety of forms, as is known in the art, and is therefore not described in detail.

Figure 6:
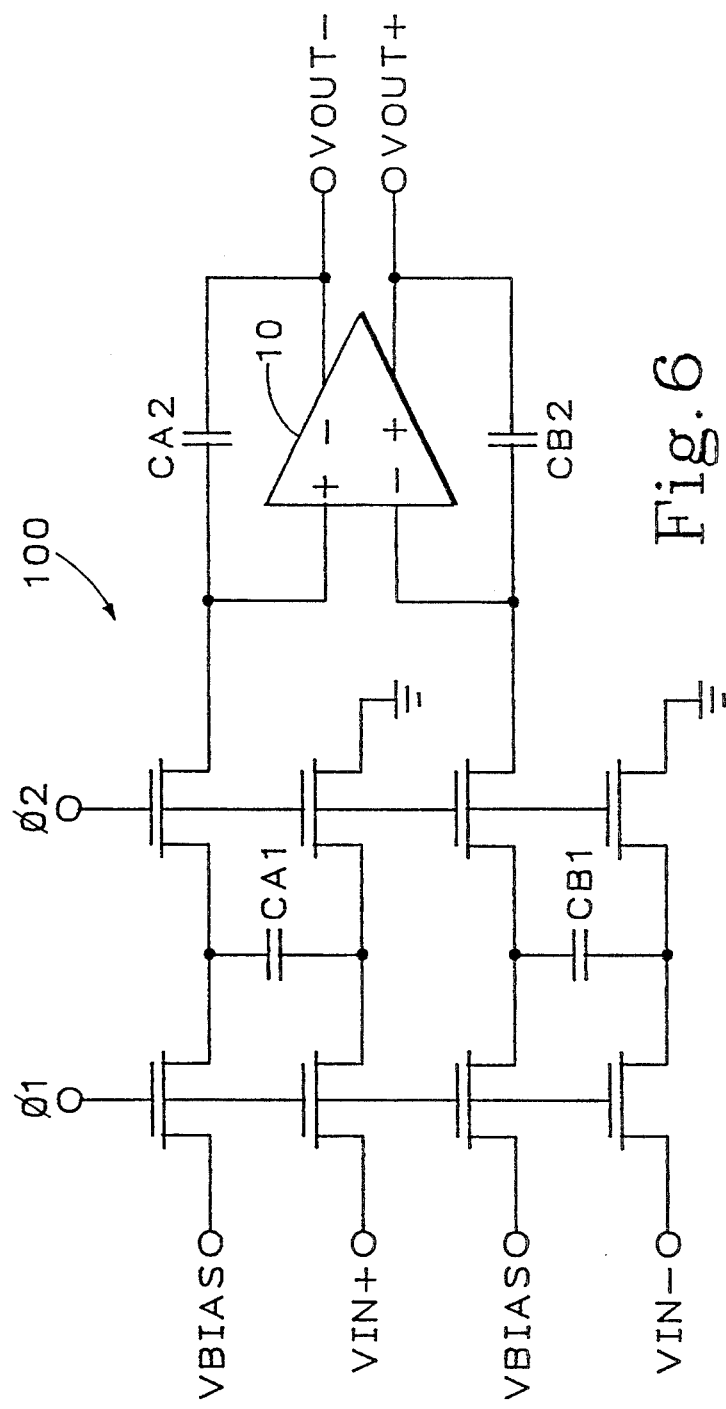
FIG. 6 is a schematic diagram of a switched capacitor (SC) integrator circuit using the operational amplifier of FIG. 4.

Referring now to FIG. 6, a switched capacitor integrator circuit 100 using the operational amplifier 10 of FIG. 4 is shown. The integrator 100 operates in a conventional manner using a non-overlapping two phase clock. The switched capacitor integrator circuit 100 is an example of an application for the operational amplifier 10 using the improved gain enhancement technique herein described. The invention, however, is not limited to the design shown or to switched capacitor circuits in general. The operational amplifier 10 is particularly well suited though for switched capacitor applications because of the high differential voltage gain and the relatively low common mode voltage gain.

Having described and illustrated the principles of the invention in a preferred embodiment thereof, it is apparent to those skilled in the art that the invention can be modified in arrangement and detail without departing from such principles. For example, alternative embodiments of the input section are possible as well as the addition of an output stage to the operational amplifier design herein described. I therefore claim all modifications and variation coming within the spirit and scope of the following claims.

We claim:

1. An operational amplifier circuit having improved common-mode rejection comprising:
   a differential input section having an input pair for receiving a differential input signal and having a differential output pair including first and second differential outputs;
   a cascode current source section having a differential input pair coupled to the differential output pair of the input section, a first cascode current source coupled to a first output of the operational amplifier and a second cascode current source coupled to a second output of the operational amplifier; and
   a cascode current mirror section having a first mirror current source coupled to the first output of the operational amplifier circuit and a second mirror current source coupled to the second output of the operational amplifier circuit, the first mirror current source having a feedback node and a control node and the second mirror current source having a feedback node and a control node, and
   a fully-differential operational amplifier having a negative input coupled to the first mirror current source feedback node, a positive input coupled to the second mirror current source feedback node, a positive output coupled to the first mirror current source control node, and a negative output coupled to the second mirror current source control node, wherein the fully-differential amplifier is constructed and arranged to amplify a differential feedback signal appearing on the feedback nodes of the first and second mirror current sources while remaining substantially unresponsive to a common-mode feedback signal appearing thereon when said operational amplified circuit is in operative condition.

2. An operational amplifier circuit according to claim 1 wherein the first mirror current source comprise;s:
   a first transistor having a source coupled to a terminal for receiving a supply voltage, a gate coupled to a terminal for receiving a first bias voltage, and a drain coupled to the first mirror current source feedback node; and
   a second transistor having a source coupled to the drain of the first transistor, a gate coupled to the first mirror current source control node, and a drain coupled to the first output of the operational amplifier.

3. An operational amplifier circuit according to claim 2 wherein the first and second transistors are P-channel field-effect-transistors (FET).

4. An operational amplifier circuit according to claim 1 wherein the second mirror current source comprises:
   a first transistor having a source coupled to a terminal for receiving a supply voltage, a gate coupled to a terminal for receiving a first bias voltage, and a drain coupled to the second mirror current source feedback node; and
   a second transistor having a source coupled to the drain of the first transistor, a gate coupled to the second mirror current source control node, and a drain coupled to the second output of the operational amplifier.

5. An operational amplifier circuit according to claim 4 wherein the first and second transistors are P-channel field-effect-transistors (FET).

6. An operational amplifier circuit according to claim 1 wherein the first cascode current source includes a feedback node coupled to the first differential output of the input section and a control node; and wherein
   the second cascode current source includes a feedback node coupled to the second differential output of the input section and a control node; and wherein the cascode current source section further includes:

a second fully-differential operational amplifier having a negative input coupled to the first cascode current source feedback node, a positive input coupled to the second cascode current source feedback node, a positive output coupled to the first cascode current source control node, and a negative output coupled to the second cascode current source control node, wherein the second fully-differential amplifier is constructed and arranged to amplifiy a differential feedback signal appearing on the feedback nodes of the first and second cascode current sources while remaining substantially unresponsive to a common-mode feedback signal appearing thereon when said operational amplified circuit is in operative condition.

7. An operational amplifier circuit having improved common-mode rejection comprising:

a differential input section including a differential input pair for receiving a differential input signal and a differential output pair including first and second differential outputs;

a cascode current mirror section having a first mirror current source coupled to it first output of the operational amplifier circuit and a second mirror current source coupled to a second output of the operational amplifier circuit; and a cascode current source section having a first cascode current source coupled to the first output of the operational amplifier circuit and a second cascode current source coupled to the second output of the operational amplifier circuit, the first cascode current source having a feedback node coupled to the second differential output of the input section and having a control node, the second cascode current source having a feedback node coupled to the first differential output of the input section and having a control node, and a fully-differential operational amplifier having a negative input coupled to the first cascode current source feedback node, a positive input coupled to the second cascode current source feedback node, a positive output coupled to the first cascode current source control node, and a negative output coupled to the second cascode current source control node, wherein the second fully-differential amplifier is constructed and arranged to amplify a differential feedback signal appearing on the feedback nodes of the first and second cascode current sources while remaining substantially unresponsive to a common-mode feedback signal appearing thereon when said operational amplified circuit is in operative condition.

8. An operational amplifier circuit according to claim 7 wherein the first cascode current source comprises:

a first transistor having a source coupled to a terminal for receiving a supply voltage, a gate coupled to a terminal for receiving a bias voltage, and a drain coupled to the first cascode current source feedback node; and a second transistor having a source coupled to the drain of the first transistor, a gate coupled to the first cascode current source control node, and a drain coupled to the first output of the operational amplifier.

9. An operational amplifier circuit according to claim 8 wherein the first and second transistors are N-channel field-effect-transistors (FET).

10. An operational amplifier circuit according to claim 7 wherein the second cascode current source comprises:

a first transistor having a source coupled to a terminal for receiving a supply voltage, a gate coupled to a terminal for receiving a third bias voltage, and a drain coupled to the second cascode current source feedback node; and a second transistor having a source coupled to the drain of the first transistor, a gate coupled to the second cascode current source control node, and a drain coupled to the second output of the operational amplifier.

11. An operational amplifier circuit according to claim 10 wherein the first and second transistors are N-channel field-effect-transistors (FET).

12. An operational amplifier circuit according to claim 7 wherein the differential input section comprises:

a biasing current source having an output for supplying bias current;

a first input transistor having a source coupled to the biasing current source output, a drain coupled to a first differential input of the cascode current source, and a gate coupled to an input terminal of the input pair for receiving a first differential input signal; and a second input transistor having a source coupled to the biasing current source output, a drain coupled to a second differential input of the cascode current source, and a gate coupled to a second input terminal of the input pair for receiving a second differential input signal.

13. An operational amplifier circuit according to claim 12 wherein the biasing current source comprises:

a first transistor having a source coupled to a terminal for receiving a supply voltage, a gate coupled to a terminal for receiving a first bias voltage, and a drain; and a second transistor having a source coupled to the drain of the first transistor, a gate coupled to a terminal for receiving a second bias voltage, and a drain coupled to the biasing current source output.

14. An operational amplifier circuit having improved common-mode rejection comprising:

a differential input section having a differential input pair for receiving a differential input signal and a differential output pair including first and second differential outputs;

a cascode current source section having a first cascode current source coupled to the first output of the operational amplifier circuit and a second cascode current source coupled to the second output of the operational amplifier circuit, the first cascode current source having a feedback node coupled to the second differential output of the input section and having a control node, the second cascode current source having a feedback node coupled to the first differential output of the input section and having a control node; and a first fully-differential operational amplifier having a negative input coupled to the first cascode current source feedback node, a positive input coupled to the second cascode current source feedback node, a positive output coupled to the first cascode current source control node, and a negative output coupled to the second cascode current source control node, wherein the first fully-differential amplifier is constructed and arranged to amplify a differential feedback signal appearing on the feedback nodes of the first and second cascode current sources while remaining substantially unresponsive to a common-mode feedback signal appearing thereon when said operational amplified circuit is in operative condition;

a cascode current mirror section having a first mirror current source coupled to the first output and a second mirror current source coupled to the second output, the first mirror current source having a feedback node and a control node and the second mirror current source having a feedback node and a control node, and a second fully-differential operational amplifier having a negative input coupled to the first mirror current source feedback node, a positive input coupled to the second mirror current source feedback node, a positive output coupled to the first mirror current source control node, and a negative output coupled to the second mirror current source control node, wherein the second fully-differential amplifier is constructed and arranged to amplify a differential feedback signal appearing on the feedback nodes of the first and second mirror current sources while remaining substantially unresponsive to a common-mode feedback signal appearing thereon when said operational amplified circuit is in operative condition.

15. An operational amplifier circuit according to claim 14 wherein the differential input section comprises a P-channel input section including P-channel field-effect-transistors (FET), the P-channel input section having It P-channel differential input pair coupled to the differential input pair of the input section for receiving the differential input signal and having a P-channel differential output pair coupled to the cascode current source.

16. An operational amplifier circuit according to claim 14 wherein the cascode current source section comprises:

a first N-channel FET having a source coupled to a terminal for receiving a supply voltage, a gate coupled to a terminal for receiving a third bias voltage, and a drain coupled to the first cascode current source feedback node;

a second N-channel FET having a source coupled to the drain of the first transistor, a gate coupled to the first cascode current source control node, and a drain coupled to the first output of the operational amplifier;

a third N-channel FET having a source coupled to a terminal for receiving a supply voltage, a gate coupled to a terminal for receiving a third bias voltage, and a drain coupled to the second cascode current source feedback node; and a fourth N-channel FET having a source coupled to the drain of the first transistor, a gate coupled to the second cascode current source control node, and a drain coupled to the second output of the operational amplifier.

17. An operational amplifier circuit according to claim 14 wherein the cascode current mirror section comprises:

a first P-channel FET having a source coupled to a terminal for receiving a supply voltage, a gate coupled to a terminal for receiving a first bias voltage, and a drain coupled to the first mirror current source feedback node;

a second P-channel FET having a source coupled to the drain of the first transistor, a gate coupled to the first mirror current source control node, and a drain coupled to the first output of the operational amplifier;

a third P-channel FET having a source coupled to a terminal for receiving a supply voltage, a gate coupled to a terminal for receiving a first bias voltage, and a drain coupled to the second mirror current source feedback node; and a fourth P-channel FET having a source coupled to the drain of the first transistor, a gate coupled to the second mirror current source control node, and a drain coupled to the second output of the operational amplifier.

18. An operational amplifier circuit having improved common-mode rejection comprising:

a differential input section having a differential input pair for receiving a differential input signal and a differential output pair including first and second differential outputs.

a cascode current source section having a first cascode current source coupled to the first output of the operational amplifier circuit and a second cascode current source coupled to the second output of the operational amplifier circuit, the first cascode current source having a feedback node coupled to the second differential output of the input section and having a control node, the second cascode current source having a feedback node coupled to the first differential output of the input section and having a control node, and a first fully-differential operational amplifier having a negative input coupled to the first cascode current source feedback node, a positive input coupled to the second cascode current source feedback node, a positive output coupled to the first cascode current source control node, and a negative output coupled to the second cascode current source control node, wherein the first fully-differential amplifier amplifies a differential feedback signal appearing on the feedback nodes of the first and second cascode current sources while remaining substantially unresponsive to a common-mode feedback signal appearing thereon; and a cascode current mirror section having a first mirror current source coupled to the first output and a second mirror current source coupled to the second output, the first mirror current source having a feedback node and a control node and the second mirror Current source having a feedback node and a control node, and a second fully-differential operational amplifier having a negative input coupled to the first mirror current source feedback node, a positive input coupled to the second mirror current source feedback node, a positive output coupled to the first mirror current source control node, and a negative output coupled to the second mirror current source control node, wherein the second fully-differential amplifier amplifies a differential feedback signal appearing on the feedback nodes of the first and second mirror current sources while remaining substantially unresponsive to a common-mode feedback signal appearing thereon:

wherein the differential input section includes a P-channel input section including P-channel field-effect-transistors (FET), the P-channel input section having a P-channel differential input pair coupled to the differential input pair of the input section for receiving the differential input signal and having a P-channel differential output pair coupled to the cascode current source, and wherein the differential input section further includes an N-channel input section including N-channel field-effect-transistors (FET) having an N-channel differential input pair coupled to the differential input pair of the P-channel input section and having an N-channel differential output pair coupled to the cascode current mirror section.

* * * * *